United States Patent [19]
Yang et al.

[11] Patent Number: 5,576,569
[45] Date of Patent: Nov. 19, 1996

[54] ELECTRICALLY PROGRAMMABLE AND ERASABLE MEMORY DEVICE WITH DEPRESSION IN LIGHTLY-DOPED SOURCE

[75] Inventors: Sheng-Hsing Yang, Hsinchu; Jyn-Kuang Lin, I-Lan, both of Taiwan

[73] Assignee: United Microelectronics Corporation, Hsin-Chu, Taiwan

[21] Appl. No.: 427,208

[22] Filed: Apr. 24, 1995

Related U.S. Application Data

[62] Division of Ser. No. 239,364, May 6, 1994, Pat. No. 5,424,233.

[51] Int. Cl.⁶ .................................................. H01L 29/788
[52] U.S. Cl. ........................... 257/321; 257/316; 257/317
[58] Field of Search ................................. 257/321, 316, 257/315, 317, 408

[56] References Cited

U.S. PATENT DOCUMENTS

| | | | |
|---|---|---|---|
| 4,622,737 | 11/1986 | Ravaglia | 257/321 |
| 5,108,937 | 4/1992 | Tsai et al. | 437/40 |
| 5,336,913 | 8/1994 | Kakiuchi et al. | 257/321 |
| 5,376,572 | 12/1994 | Yang et al. | 257/316 |
| 5,502,321 | 3/1996 | Matsushita | 257/321 |

FOREIGN PATENT DOCUMENTS

| | | | |
|---|---|---|---|
| 1-81368 | 3/1989 | Japan | 257/321 |
| 4-221857 | 8/1992 | Japan | 257/317 |

OTHER PUBLICATIONS

"Optimization of a Source–Side–Injection FAMOS Cell for Flash EPROM Application", David R. Y. Lui et al, IEDM Tech. DIG. 1991 pp. 315–318.

*Primary Examiner*—Robert P. Limanek
*Attorney, Agent, or Firm*—William H. Wright

[57] ABSTRACT

An improved structure and process of fabricating a programmable and erasable read only memory device wherein a thick oxide region is formed on the surface of a semiconductor substrate. The thick oxide region is removed forming a depression in the surface. Impurity ions are implanted into the depression forming a lightly doped source region. A tunnel oxide layer is formed on the substrate surface. Next, the floating gate layer is formed on the tunnel oxide layer which at least partially overlies the lightly doped source region. A gate isolation layer and control gate layer are formed over the floating gate layer. Subsequently, the source and drain regions are formed in the substrate on opposite sides of the gate structure. A dielectric layer is formed over the control gate region and substrate. Contact opening are formed. Electrical contacts and metallurgy lines with appropriate passivation are formed that connect the source, drain and gate elements to form an electrical programmable memory device.

8 Claims, 3 Drawing Sheets

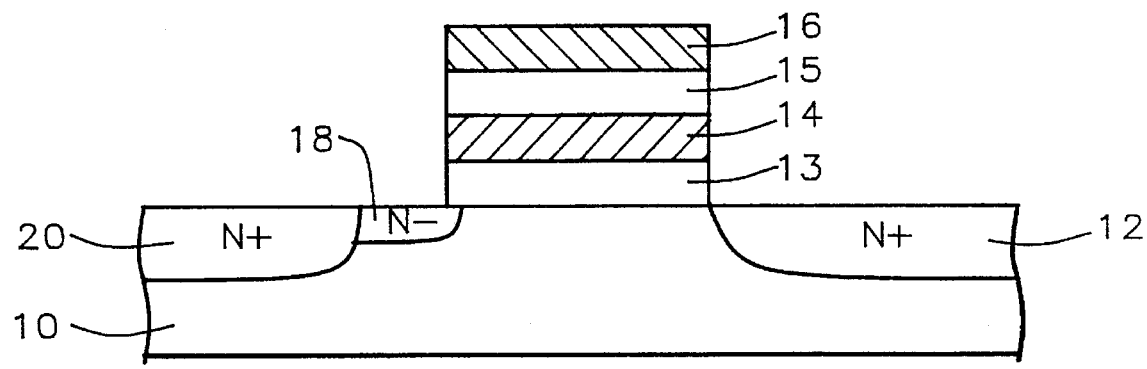
FIG. 1 – Prior Art
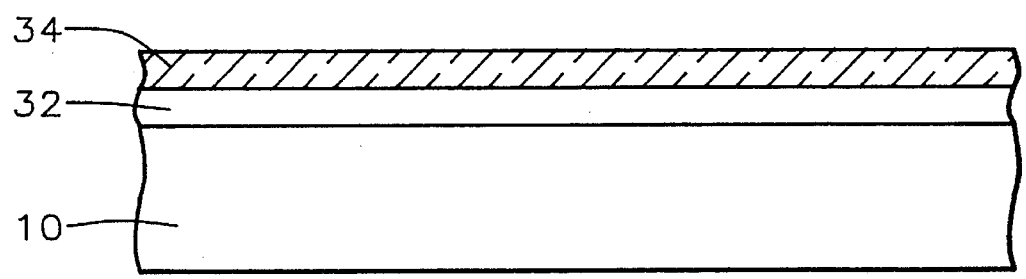
FIG. 2
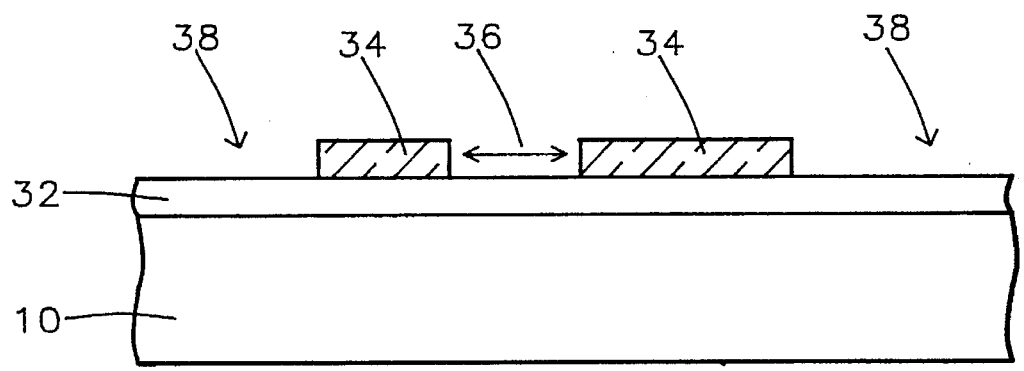
FIG. 3

ELECTRICALLY PROGRAMMABLE AND ERASABLE MEMORY DEVICE WITH DEPRESSION IN LIGHTLY-DOPED SOURCE

This is a divisional of application Ser. No. 08/239,364 filed May 6, 1994, now U.S. Pat. No. 5,424,233.

BACKGROUND OF INVENTION

1) Field of the Invention

This invention relates to semiconductor devices and more particularly to an improved structure and method for producing erasable programmable read only memory devices (EPROM's).

2) Description of the Prior Art

In the last decade, semiconductor memories have been the fastest growing segment of the semiconductor industry, with the large increase due to the rapid growth of the digital electronic market with multiplying applications. Moreover, erasable programmable read only memory devices (EPROM's) are being produced in larger quantities.

There are many types of memory devices. Memory units that are frequently read from but seldom or never written into, such as the control programs in hand calculators, are known as read-only memories (ROM's). ROM's have permanent information placed in them during manufacture. Programmable ROM's (PROMs) may be manufactured as standard units and then have permanent information implanted in them by a pattern of electrical signals. Most importantly, erasable programmable ROM's (EPROM's), may have new information implanted in them from time to time by the user.

The microminiturzation of electronic devices creates the need to make higher density EPROM's. Microminiturzation increases the speed of operation and reduces production costs. However, new device structure and processing constraints emerge as EPROM's are made at higher densities.

One important EPROM constraint is the tradeoff between efficient programmability and reliable device operations. EPROM programmability is determined by successful device write and erase operations. Also, immunity to drain and read disturbances determines EPROM device reliability.

A recent improvement in EPROM device structures appears in Liu, David K. Y. et al., "Optimization of a Source-Side-Injection FAMOS Cell for Flash EPROM Applications", IEDM Tech,. Dig., 1991, pp. 315–318. Lui describes a source-side-injection FAMOS cell for an EPROM which improves upon the conventional EPROM cell. Lui describes a source side injection FAMOS cell whose high resistive region is implemented with a non-overlapped and lightly doped region at the source end. FIG. 1 shows a conventional structure as described by Lui. The convention EPROM device is built on semiconductor substrate 10 and contains a source 20, a drain 12, a floating gate 14, a control gate 16, tunnel oxide 13, and insulator 15. As shown in FIG. 1, a lightly doped source 18 is non-overlapping with the floating gate and the drain. This structure including the lightly doped source 18 is referred to as a floating-gate avalanche-injection MOS (FAMOS) cell.

A Flash EPROM cell uses Channel Hot Electron injection at the drain to perform a write operations. Also, a Flash EPROM cell uses Fowler-Nordheim tunneling at the source to constitute erase operation. The rate of write and erase operations are influenced by the strength of the electric field between the lightly doped source and the floating gate. The higher the electric field, the faster the erase and write operations.

The conventional device as described by Lui could be improved if the electric field between the source to the floating gate could be increased. A higher electric field would increase the device erase and write rates. A higher source to gate electric field would increase the Fowler-Nordheim tunneling current from the floating gate to the lightly doped source which would increase the erase rate. Also, a higher gate to source vertical electric field would increase the channel hot electron generation from the lightly doped source to the floating gate which increases the write operation rate.

The electric field between the lightly doped source and floating gate can be increased by reducing the tunnel oxide thickness. But if the tunnel oxide thickness is reduced below 80 to 120 Angstroms, pinholes in the oxide reduce device reliability and yields. Therefore, an opportunity exists to increase the electric field between the lightly doped source and the gate while maintaining yields.

A method of producing a recessed gate metal oxide semiconductor field effect transistor device (MOSFET) that seeks to reduce the source to drain leakage problem is shown in U.S. Pat. No. 5,108,937. However in this invention a recessed gate structure is formed after the source and drain are formed in a MOSFET device. The MOSFET and EPROM devices have much different structures and electrical characteristics. Therefore, U.S. Pat. No. 5,108,937 is not applicable to EPROM devices.

SUMMARY OF INVENTION

It is a general object of the invention to provide an improved structure for an erasable programmable read only memory devices.

A more specific object of the present invention is to provide an improved structure for source-side-injection floating-gate avalanche metal oxide semiconductor (FAMOS) cell for erasable programmable read only memory (EPROM) applications for which the erase and write rates are increased.

Still another object of the present invention is to provide a process to fabrication an improved structure for source-side-injection FAMOS cell for erasable programmable read only memory applications whereby the erase and write operation rates are increased.

In accordance with the above objects, a structure and a method for an improved EPROM is provided. A thin insulating layer and an oxidation resistant masking layer are formed on the surface of a semiconductor substrate having a background dopant of a first conductivity type. Openings are formed in the masking layer that define the field oxide regions and a first opening is formed which defines the lightly doped source region. Next, oxide is grown in the openings forming field oxide regions and thick oxide is grown in the first openings. The masking layer is then removed. A resist layer with a second opening defining the lightly doped source regions is formed on the substrate surface. Ions of a second opposite conductivity type are implanted through the second opening to form the lightly doped source region. The resist layer and remaining thin insulating layer are then removed.

Following this, the tunnel oxide layer is formed on the substrate surface. Next, the floating gate layer is formed on the tunnel oxide layer so that it at least partially overlies the lightly doped source region. Then the gate isolation layer and control gate layer are formed over the floating gate layer.

Subsequently, the source and drain regions are formed in the substrate on opposite sides of the gate structure. The source is adjacent to the lightly doped source. The region between the source and drain is the channel region. Now a dielectric layer is formed over the control gate region and substrate. Contact openings are formed. Electrical contacts and metallurgy lines with appropriate passivation are formed that connect the source, drain and gate elements to form an electrical programmable memory device.

BRIEF DESCRIPTION OF THE DRAWINGS

The drawings show the following:

FIG. 1 is cross-sectional view in broken section in greatly enlarged scale that illustrates a process for forming an electrically programmable memory device in accordance with the prior art process.

FIGS. 2 through 8 are a sequence of cross-sectional views in broken section in greatly enlarged scale that illustrate the improved electrically programmable memory device at various stages of fabrication in accordance with the process of the invention.

DETAILED DESCRIPTION OF THE PREFERRED EMBODIMENTS

Figure 4:
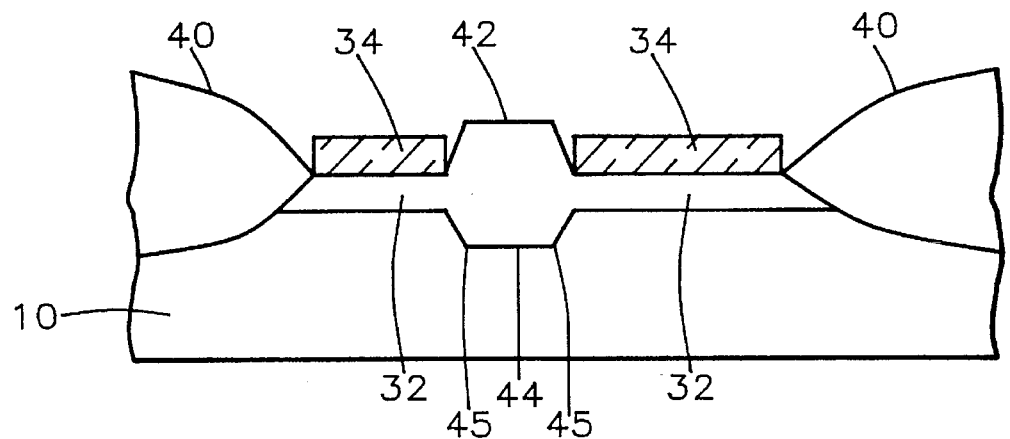

The present inventions will be described in detail with reference to the accompanying drawings. It should be noted that the drawings are in greatly simplified form. In practice the memory device structure will be one of many supported on a common substrate connected with suitable metallurgy in various electronic circuit configurations.

Referring now to FIG. 2, there is shown substrate 10 which shall be a monocrystalline silicon semiconductor body with many devices fabricated therein, as is well known in the art. The substrate 10 is preferable formed of monocrystalline silicon having a surface plane with a crystalline orientation of <1 0 0>. The background substrate dopant is preferably boron, with a concentration in the range of 8E15 to 8E16 atoms/cm$^3$. Substrate 10, embodies a background doping of a first type dopant, preferably P-type. Next, a thin insulating layer 32 is formed on the surface of the semiconductor substrate. The thin insulating layer 32 is preferably composed of silicon oxide with a thickness in the range of 350 to 1500 angstroms and preferably 600 angstroms.

An oxidation resistant masking layer 34 is then formed over the thin insulating layer 32. The oxidation resistant masking layer is preferably formed of silicon nitride with a thickness in the range of 1000 to 3000 angstroms and with a thickness more preferably 1500 angstroms. Layer 34 can be formed of silicon nitride by reacting silane and ammonia at atmospheric pressure at 700° to 900° C., or by reacting dichlorosilane and ammonia at reduced pressure at approximately 700° C. Also, Silicon nitride can be formed by plasma enhanced chemical vapor deposition by reacting silane with ammonia or nitrogen in a glow discharge between 200° and 350° C.

Now referring to FIG. 3, openings 38 in masking layer 34 are formed that define the thick field oxide regions. Also, a first opening 36 is formed which defines the lightly doped source region.

As shown in FIG. 4 thick field oxide 40 is formed in the openings 38 that define the field oxide layer and a thick oxide 42 is formed said first opening 36. The field oxide layer 40 has a thickness in the range of 5000 to 10,000 angstroms and more preferably a thickness of 6000 angstroms. The thick oxide 42 has a thickness in the range of 5000 to 10,000 angstroms and more preferably a thickness of 6000 angstroms.

Field oxide layer 40 and thick oxide layer 42 can be formed by a conventional atmospheric thermal process where water vapor is reacted with the exposed substrate at a temperature in the range of 700° to 1200° C. In the reaction forming the oxide layer 40 and 42, a portion of the underlying silicon is consumed. Typically, for a given silicon oxide thickness, the amount of substrate consumed is approximately one half of the oxide thickness. As illustrated in FIG. 4, this consumption of the silicon substrate forms a depression or a hollow 44 with rounded bottom corners 55 in substrate surface.

Figure 5:
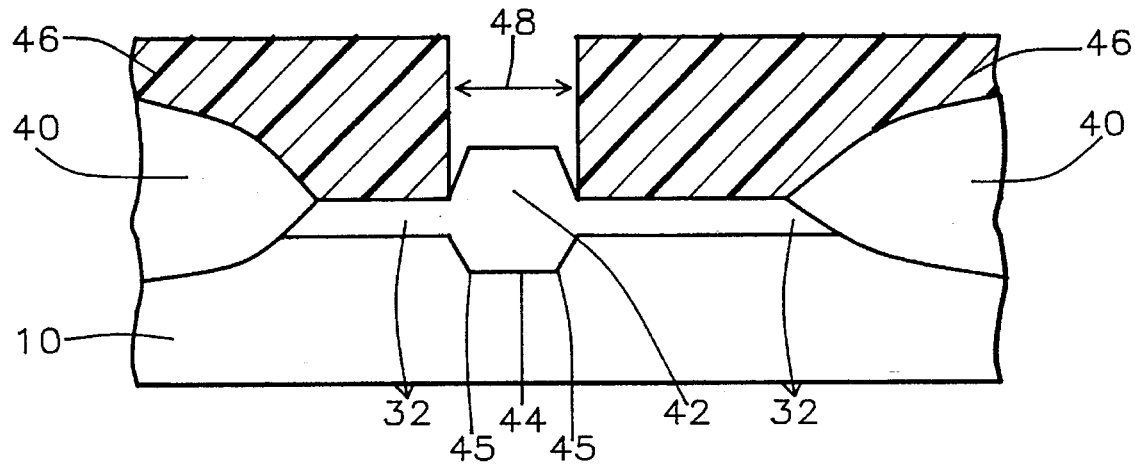

FIG. 5 shows the oxidation masking layer 34 removed. Layer 34 can be removed by any etch process that has a high silicon nitride to silicon oxide selectivity such as a reactive ion etch using $CH_2F_2$ or $CH_3F$ as source gases. Next, a resist layer 46 is formed over the substrate surface with a second opening 48 over said first opening 36. The thick oxide 42 that is exposed through the second opening 48 is completely removed thereby revealing the depression 44 in the substrate surface. The surface depression 42 has a depth in the range of 2500 to 5000 Angstroms and the width of the depression is in the range of 0.8 to 1.2 microns.

Figure 6:
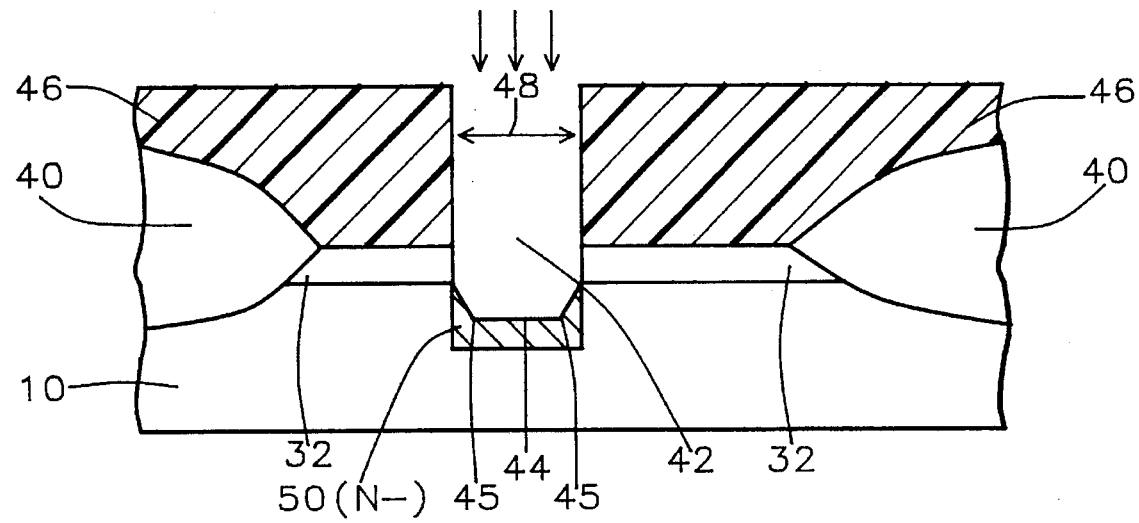

Then as shown on FIG. 6, impurity ions of a second conductivity type are implanted into the substrate through the second opening forming a lightly doped source region 50. The lightly doped source region 50 is formed by ion implantation with a implant energy in the range of 50 to 80 Kev. and dosage in the range of 8E12 to 3E13 atoms/cm$^2$. The ion implanted to form the lightly doped source 50 can be arsenic, phosphorus, or other suitable N-type ions. Next the resist layer 46 and the remaining thin insulation layer 32 is removed.

Figure 7:
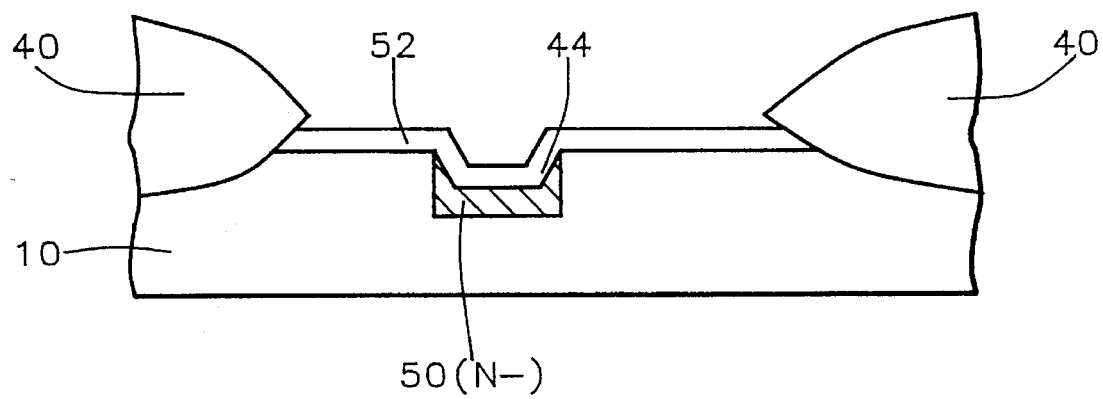

FIG. 7 shows the formation of the tunnel oxide layer 52 on the exposed substrate. The tunnel oxide layer 52 has thickness is in the range of 80 to 120 angstroms and a thickness more preferably 100 angstroms.

Figure 8:
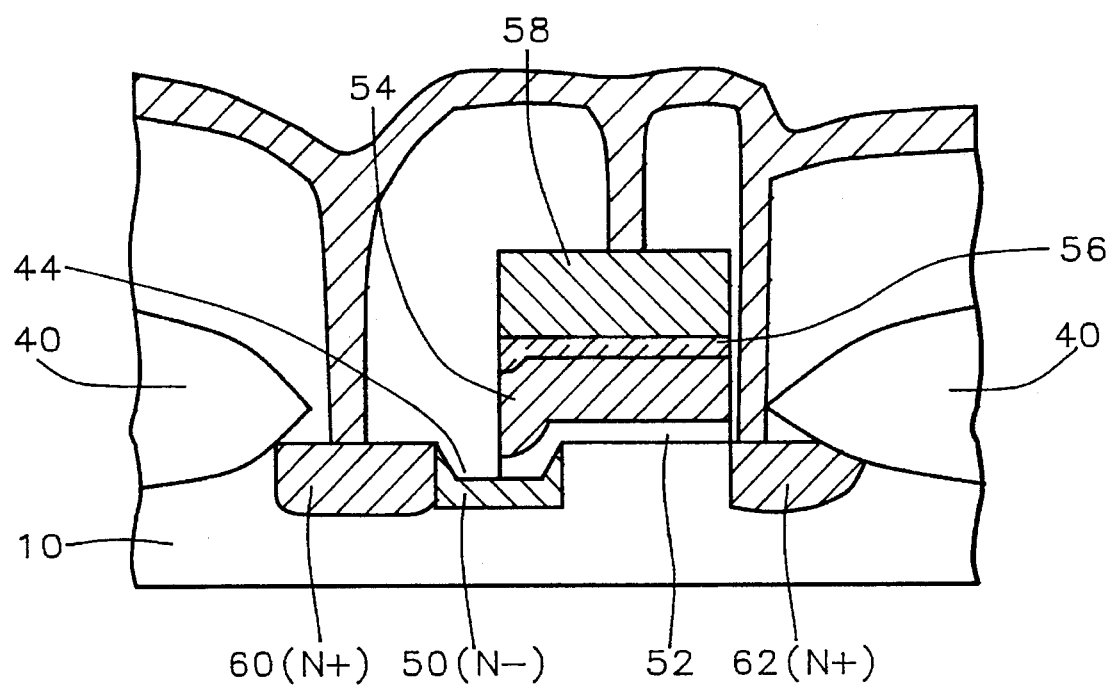

FIG. 8 shows a floating gate 54 is formed on the tunnel oxide layer 52 that at least partially overlays said depression 44 and lightly doped source region 50. The floating gate electrode 54 partially overlays from 30 to 70 % of the lightly doped source 50 and overlays preferably more in the order of 50% of the lightly doped source 50. This overlay is important to the device performance. The vertical electric field between the lightly doped source and the floating gate is increased at the rounded corners of the hollow 44. This increased electric field increases the device erase and write rate above that achievable for the conventional FAMOS device for a given tunnel oxide thickness.

The floating gate 54 can be formed of polycrystalline silicon material. The polycrystalline silicon floating gate 54 can be deposited by prolyzing silane in a low pressure chemical vapor deposition process at approximately 620° C.

Following this a gate isolation layer 56 is formed on the floating gate layer 54. Layer 56 can be formed of any suitable material, but is preferably a composite layer of silicon oxide, silicon nitride and silicon oxide, which is called ONO.

A control gate layer 58 is formed over the floating gate layer 54 and the gate isolation layer 56. The control gate layer 58 can be formed of polycrystalline silicon.

Next, an ion implantation masking layer is formed with openings over regions which define the source and drain regions. Then impurity ions are implanted into the substrate to form source 60 and drain 62 regions. The source 60 and drain 62 regions are formed by ion implantation with a implant energy in the range of 50 to 80 Kev. and dosage in the range of 3E15 to 1E16 atoms/cm$^2$. The source and drain dopant ions can be phosphorus, arsenic or other suitable N-type impurity ion.

A dielectric layer (not shown) is formed over the control gate electrode and substrate. The dielectric layer can be formed of a silicon oxide material deposited by a conventional chemical vapor deposition process. Next, electrical contacts are formed to the source 60, drain 62, and gate 58 regions as is well known in the art.

This invention produces devices with a faster erase and write operations than the conventional FAMOS device because the invention utilizes several important features. These important features are the lightly doped source 50 which is partially overlapped by the floating gate 44 and the formation of the tunnel oxide 52 and the floating gate 54 over a concave hollow 44 with rounded corners. The rounded corners of the hollow 44 increase the electric field between the source and the floating gate. This increased electric field increases the source to gate current which increases the speed of the erase and write operations.

While the invention has been particularly shown and described with reference to the preferred embodiments thereof, it will be understood by those skilled in the art that various changes in form and details may be made without departing from the spirit and scope of the invention.

What is claimed is:

1. An improved electrically programmable erasable read only memory device with enhanced source side injection and write/erase operations comprising:

a semiconductor substrate having the background dopant of a first type impurity;

spaced source and drain regions of a second opposite conductivity type in said substrate separated by a channel region;

a lightly doped source region, adjacent to the source region, disposed between the source region and drain region;

a channel region disposed between said lightly doped source region and said drain region;

a tunnel oxide on said substrate overlying at least said channel region and partially overlying said lightly doped drain region;

a floating gate region overlying said channel region and partially overlying said lightly doped source region;

a gate insulation layer over said floating gate region;

a control gate region over said floating gate;

a surface depression over said lightly doped source region;

a portion of said tunnel oxide extending into said depression;

and a portion of said floating gate extending into said depression.

2. The device of claim 1 wherein the background impurity of a first type is P type and the impurity of a second type is N-type.

3. The device of claim 1 wherein the surface depression has a depth from the substrate surface in the range of 2500 to 5000 angstroms and the depression has rounded bottom corners.

4. The device of claim 1 wherein the lightly doped source is formed by ion implantation with an implant energy in the range of 50 to 80 Kev. and dosage in the range of 8E12 to 3E13 atoms/cm$^2$.

5. The device of claim 1 wherein the gate isolation layer is a three layer sandwich structure consisting of a silicon oxide layer, a silicon nitride layer and a silicon oxide layer.

6. The device of claim 1 wherein the floating gate overlies from 30 to 70 percent of the surface area of the lightly doped source region.

7. The device of claim 1 wherein the tunnel oxide thickness is in the range of 80 to 120 angstroms.

8. The device of claim 1 wherein the substrate has field oxide regions with a thickness in the range of 5000 to 10,000 angstroms.

* * * * *